United States Patent [19]

Nakajima et al.

[11] Patent Number: 4,914,403
[45] Date of Patent: Apr. 3, 1990

[54] CESIUM OSCILLATOR

[75] Inventors: Yoshifumi Nakajima, Kawasaki; Kazuharu Chiba, Yokohama; Hideo Sumiyoshi, Kawasaki, all of Japan

[73] Assignee: Fujitsu Limited, Kawasaki, Japan

[21] Appl. No.: 381,457

[22] Filed: Jul. 18, 1989

[30] Foreign Application Priority Data

Jul. 19, 1988 [JP] Japan .................. 63-179614

[51] Int. Cl.$^4$ ............................................. H03L 7/26
[52] U.S. Cl. ................................. 331/3; 331/94.1
[58] Field of Search ......................... 331/3, 94.1

[56] References Cited

U.S. PATENT DOCUMENTS

3,364,438 1/1968 Rorden .................... 331/3

Primary Examiner—Eugene R. LaRoche
Assistant Examiner—Robert J. Pascal
Attorney, Agent, or Firm—Staas & Halsey

[57] ABSTRACT

A cesium oscillator includes a cesium beam tube, and an oscillator circuit which generates an oscillation signal of a frequency to be supplied to the cesium beam tube. A frequency control circuit including a sweep circuit and a feedback loop circuit continuously varies the frequency of the oscillation signal. The frequency of the oscillation signal is continuously varied two times when the frequency of the oscillation signal is to be adjusted. A hold circuit holds the highest signal level of the resonance signal supplied from the cesium beam tube when the frequency control circuit continuously varies the frequency of the oscillation signal first. A control circuit controls the frequency control circuit so as to stop continuously varying the frequency when a signal level of the resonance signal obtained by continuously varying the frequency of the oscillation signal by the frequency control circuit for the second time becomes equal to the highest signal level held by the hold circuit.

22 Claims, 6 Drawing Sheets

(A) ONE SHOT MULTI OUTPUT (B) INTEGRATOR OUTPUT

TO COMPARATOR 241

CESIUM OSCILLATOR

BACKGROUND OF THE INVENTION

The present invention generally relates to a cesium oscillator, and particularly to a cesium oscillator capable of providing a high-precision oscillation output based on the atomic resonance effect of cesium.

Currently, a cesium oscillator is used as a high-precision oscillation source in communication systems, for example. A cesium oscillator uses the inherent stability of the atomic resonance frequency of $Cs^{133}$.

Figure 1:
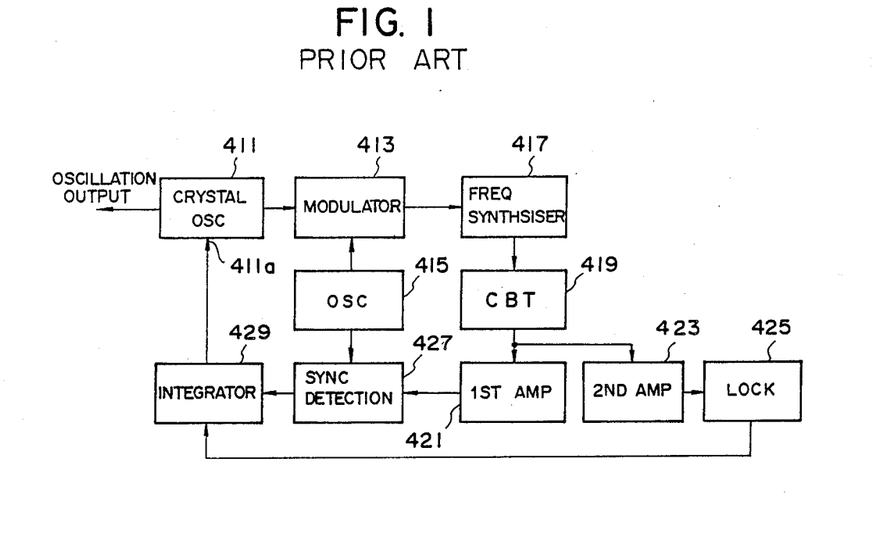
FIG. 1 is a block diagram of a conventional cesium oscillator.

Referring to FIG. 1, there is illustrated a conventional cesium oscillator. As shown, a conventional cesium oscillator includes a crystal oscillator 411, a modulator 413, an oscillator 415, a frequency synthesiser and multiplier 417, a cesium beam tube 419, a first bandpass amplifier 421, a second bandpass amplifier 423, a lock circuit 425, a synchronous detector 427, and an integrator 429.

The oscillator 411 outputs a signal of a predetermined frequency (10 MHz, for example) to be provided by a cesium oscillator. The cesium beam tube 419 includes a cesium beam source, a cavity, a detector and magnets. The cavity provides a cesium beam derived from the cesium beam source with a microwave of a frequency nearly equal to a predetermined frequency (about 9.192 GHz). The detector detects atoms of $Cs^{133}$.

Figure 2:
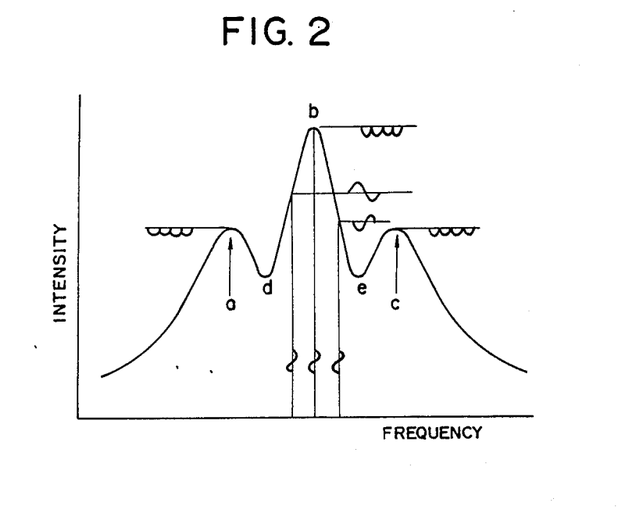
FIG. 2 is a graph of a resonance pattern observed in a cesium beam tube used in the cesium oscillator of FIG. 1.

FIG. 2 is a graph of a resonance pattern observed in the cesium beam tube 419. In FIG. 2, the horizontal axis represents frequencies of the microwave, and the vertical axis represents the intensity of the observed resonance. It is noted that the frequency of a microwave which actually causes a resonance in the cesium beam tube 419, is equal to the frequency of a signal obtained by phase-modulating the output signal of the crystal oscillator 411 by an output signal of the oscillator 415 (100 Hz, for example) by the modulator 413 and by frequency-synthesizing the phase-modulated signals. Thus, an output signal of the cesium beam tube 419 related to a certain phase-modulated microwave includes an alternating component. The intensity of resonance is proportional to the amplitude level of the above-mentioned alternating component. As a result, the 180° phase inversion occurs in the output signal of the cesium beam tube around peak points (a, b, c in FIG. 2) of the spectrum.

The cesium oscillator controls the frequency of the signal derived from the crystal oscillator 411 based on the alternating output signal extracted from the cesium beam tube 419. A fundamental wave signal included in the output signal of the cesium beam tube 419 is amplified through the first bandpass amplifier 421. Then the amplified signal from the first bandpass amplifier 421 is subjected to a synchronous detection by the synchronous detector 427, which outputs a detection signal. The integrator 429 integrates the detection signal supplied from the synchronous detector 427, and supplies a control terminal 411a of the crystal oscillator 411 with a control voltage based on the integrated output levels derived from the integrator 429. The frequency of the crystal oscillator 411 is controlled based on the applied voltage. In the above-mentioned manner, a feedback loop responsive to the output signal of the crystal oscillator 411 is formed, and thus it becomes possible to fix the output frequency of the crystal oscillator 411 with high precision.

After starting up the cesium oscillator, a second-harmonic frequency signal included in the output signal of the cesium beam tube 419 is amplified through the second bandpass amplifier 423. The second-harmonic frequency signal is a signal of a frequency which is twice the modulation signal, and is generated when a microwave presenting a peak point such as peak point a, b, c, d or e is supplied to the cesium beam tube 419. The phase of the output signal derived from the cesium beam tube 419 is different by 180° on both sides of each of the peak points a, b and c. The lock circuit 425 holds the signal from the second bandpass amplifier 423 when any one of the peaks is detected. Then, the lock circuit 425 supplies the integrator 429 with an instruction based on the peak detection. Then, the feedback loop for controlling the crystal oscillator 411 is established in response to the instruction.

However, the above-mentioned conventional cesium oscillator has the following disadvantages.

Figure 3:
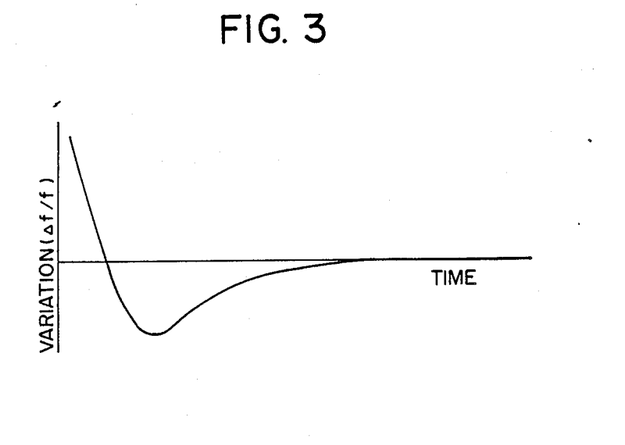
FIG. 3 is a graph of the frequency transient response of a crystal oscillator used in the cesium oscillator of FIG. 1.

First, the crystal oscillator 411 exhibits a frequency transient response as shown in FIG. 3, immediately after starting the power supply to the cesium oscillator. In FIG. 3, the horizontal axis represents time, and the vertical axis represents a variation of frequency ($\Delta f/f$). It is therefore necessary to set the adjustable frequency range (control range) of the crystal oscillator 411 so that the desired (highest) peak point b of the spectrum is present in the adjustable frequency range after the frequency is settled. As a result, the adjustable frequency range of the crystal oscillator 411 must be set narrow, and therefore the gain of the feedback loop is small.

Figure 4:
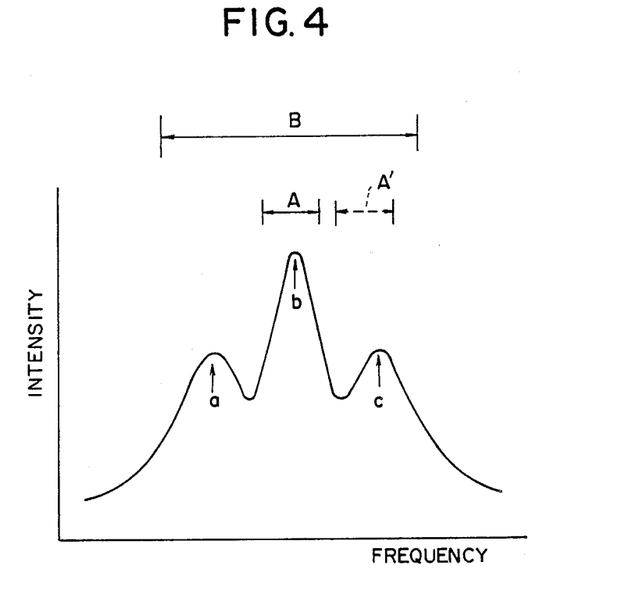
FIG. 4 is a graph of the resonance pattern of FIG. 2, in which adjustable frequency ranges are shown.

FIG. 4 illustrates an appropriate adjustable frequency range A in which only the peak point b is included. If the adjustable frequency range of the crystal oscillator 411 is wide as indicated by a reference B, an increased gain of the feedback loop can be obtained. However, in this case, there is a possibility that the feedback loop related to the oscillator 411 may be stabilized at the peak point a or c. Further, if the adjustable frequency range deviates from the appropriate position, as shown by a broken line given a reference A,, it is impossible to stabilize the crystal oscillator 411 at the peak point b.

Secondly, the adjustable frequency range shifts due to aging. For example, the adjustable frequency range A shown in FIG. 4 may be changed to the adjustable frequency range A, due to aging. In such cases, the highest-peak point b may be out of the adjustable frequency range. Alternatively, another smaller peak point may be included in the adjustable frequency range in place of or together with the highest-peak point b. In order to avoid this problem, it is necessary to use a high-grade and expensive crystal oscillator. Further, the adjustment procedure is manually performed and is therefore troublesome.

SUMMARY OF THE INVENTION

It is therefore a general object of the present invention to provide an improved cesium oscillator in which the above-mentioned disadvantages are eliminated.

A more specific object of the present invention is to provide a cesium oscillator which has an increased adjustable frequency range and an increased gain of the feedback loop and which can easily be adjusted so as to provide an oscillation frequency based on the greatest resonance peak.

Another object of the present invention is to provide a cesium oscillator which is capable of generating high-precision frequency signal irrespective of age deterioration.

The above objects of the present invention can be achieved by a cesium oscillator comprising an cesium beam tube, oscillator means, coupled to the cesium beam tube, for generating an oscillation signal (output frequency signal of a VCXO, Voltage Control Crystal Oscillator) of a frequency, the cesium beam tube being supplied with the oscillation signal and thereby outputting a resonance signal, sweep means, coupled to the oscillator means, for continuously varying the frequency of the oscillation signal, the frequency of the oscillation signal being continuously varied two times when the frequency of the oscillation signal is to be adjusted, hold means, coupled to the cesium beam tube, for holding the highest signal level of the resonance signal supplied from the cesium beam tube when the sweep means continuously varies the frequency of the oscillation signal first, and control means, coupled to the oscillator means, the sweep means and the hold means, for controlling the sweep means so as to stop continuously varying the frequency when the signal level of the resonance signal obtained by continuously varying the frequency of the oscillation signal by the sweep means for the second time, becomes equal to the highest signal level (the largest second-harmonic signal) held by the hold means.

The aforementioned objects of the present invention can also be achieved by a cesium oscillator comprising oscillator means for generating an oscillation signal of a frequency, a cesium beam tube, modulation means, coupled to the oscillator means and the cesium beam tube, for providing the oscillation signal with an alternating signal component and for supplying the oscillation signal having the alternating signal to the cesium beam tube, the cesium beam tube outputting a signal including a first signal component of a first frequency and a second-harmonic frequency signal component, controlling means, coupled to the cesium beam tube and the oscillator means, for controlling the frequency of the oscillation signal on the basis of the first signal component supplied from the cesium beam tube, sweep means, coupled to the oscillator means, for continuously varying the frequency of the oscillation signal generated by the oscillator means over a predetermined frequency range, hold means, coupled to the cesium beam tube, for holding the highest level of the second-harmonic frequency signal component, comparing means, coupled to the cesium beam tube and the hold means, for comparing the signal level of the second-harmonic frequency signal component with the highest level held by the hold means and for outputting comparison results, and loop controlling means for establishing a feedback loop including the oscillator means, the cesium beam tube, the modulation means and the controlling means so as to fix the frequency of the oscillation signal to a predetermined frequency when the comparison results satisfy a predetermined condition.

The above objects of the present invention will become apparent from the following detailed description when read in conjunction with the accompanying drawings.

DESCRIPTION OF THE PREFERRED EMBODIMENTS

Figure 5:
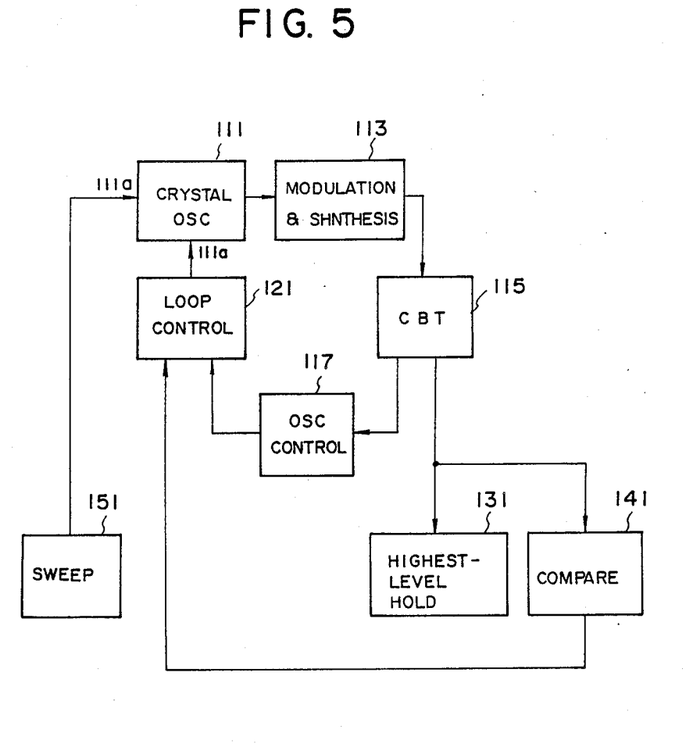
FIG. 5 is a block diagram of the principle of the present invention.

A description is given of the principle of the present invention with reference to FIG. 5. According to the principle of the present invention, a cesium oscillator includes a crystal oscillator (VCXO) 111, a cesium beam tube 115, a modulation and synthesis circuit 113, an oscillator control circuit 117, a loop control circuit 121, a highest-level hold circuit 131, a comparator circuit 141 and a sweep circuit 151. The crystal oscillator 111 generates a signal of a predetermined frequency signal. The modulation and synthesis circuit 113, which includes a modulator, a synthesiser and multiplier circuit, and an oscillator, provides the cesium beam tube 115 with a microwave signal obtained by modulating the output signal of the frequency oscillator 111 by a signal derived from the built-in oscillator. The oscillator control circuit 117 controls the oscillation frequency of the crystal oscillator 111 on the basis of the output signal (resonance signal) supplied from the cesium beam tube 115. For this purpose, the oscillator control circuit 117 supplies a control voltage based on the output signal from the cesium beam tube 115 to a control terminal 111a of the crystal oscillator 111. It is noted that the above-mentioned blocks 111, 113, 115 and 117 are identical to corresponding elements used in the aforementioned conventional cesium oscillator.

The sweep circuit 151 supplies another control terminal 111a of the crystal oscillator 111 with an instruction for continuously varying the oscillation frequency of the crystal oscillator 111. The highest-level hold circuit 131 holds the highest one of the (amplitude) levels of second-harmonic frequency signals which are output from the cesium beam tube 115. The second-harmonic frequency signal is a signal of a frequency which is twice the frequency of the signal derived from the oscillator built in the modulation and synthesis circuit 113. The comparator circuit 141 compares the held highest-level with the levels of the second-harmonic frequency signals supplied from the cesium beam tube 115. The loop control circuit 121 makes a feedback loop open or closed. This feedback loop is made up of the crystal oscillator 111, the modulation and synthesis circuit 113, the cesium beam tube 115 and the oscillator control circuit 117.

In operation, the sweep circuit 151 supplies the control terminal 111a of the crystal oscillator 111 with the instruction (control voltage) which makes the oscillation frequency continuously change over a predetermined range, which is selected so as to include the peak points a, b and c shown in FIG. 2. The highest-level hold circuit 131 holds the highest level (the largest second-harmonic signal) among the levels of the second-harmonic frequency signals derived from the cesium beam tube 115. After sweeping the oscillation frequency of the crystal oscillator 111 once, the sweep circuit 151 supplies the crystal oscillator 111 with the same instruction again. Thereby, the oscillation frequency of the crystal oscillator 111 is continuously varied over the aforementioned predetermined range. During the second sweeping operation, the comparator circuit 141 compares the levels of the second-harmonic frequency signals supplied from the cesium beam tube 115 with the highest level held in the highest-level hold circuit 131. When a predetermined condition is satisfied, the comparator circuit 141 supplies the loop control circuit 121 with an instruction. For example, a decision about whether the predetermined condition is satisfied, is made by discerning whether one of the levels of the second-harmonic frequency signals from the cesium beam tube 115 is equal to the highest level. When receiving the instruction from the comparator circuit 141, the loop control circuit 121 connects the oscillator control circuit 117 and the crystal oscillator 111 to thereby establish the feedback loop related to the crystal oscillator 111. According to the present invention, it becomes possible to provide an increased adjustable frequency range and thus an increased gain of the feedback loop. Therefore, an economical crystal oscillator can be used. Further, the adjustment procedure is made simple. Moreover, the oscillation frequency is immune to age deterioration.

Figure 6:
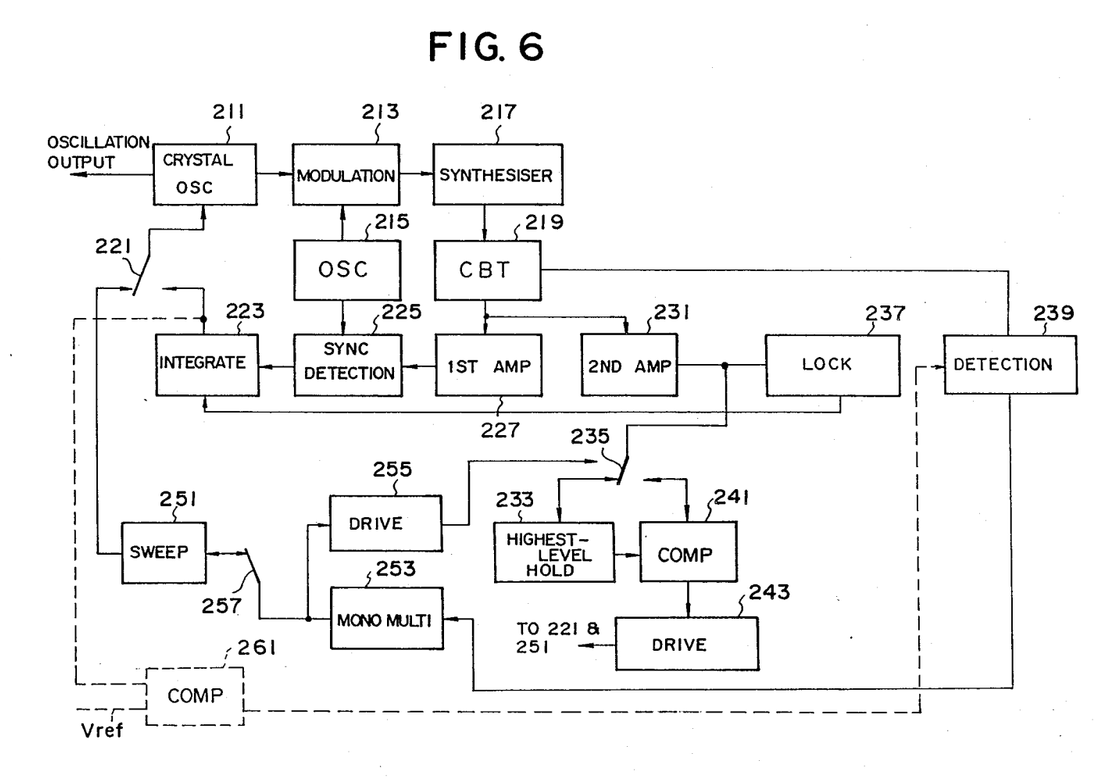
FIG. 6 is a block diagram of a preferred embodiment of the present invention.

A description is given of a preferred embodiment of the present invention. Referring to FIG. 6, there is illustrated a cesium oscillator according to the preferred embodiment of the present invention. The correspondence between the structure of FIG. 5 and the structure of FIG. 6 is first described. The crystal oscillator 111 corresponds to a crystal oscillator (VCXO) 211 shown in FIG. 6. The modulation and synthesis circuit 113 includes a modulator 213, a synthesiser 217 including a frequency multiplier, and an oscillator 215, which are the same as those shown in FIG. 1. The cesium beam tube 115 corresponds to a cesium beam tube (CBT) 219. The oscillator control circuit 117 includes a first bandpass amplifier 227, a synchronous detector 225, and an integrator 223, which are the same as those shown in FIG. 1. The loop control circuit 121 includes a contact 221 and a drive circuit 243. The highest-level hold circuit 131 includes a second bandpass amplifier 231 and a highest-level hold circuit 233. The comparator circuit 141 includes the second bandpass amplifier 231 and a comparator 241. The sweep circuit 151 includes a sweep circuit 151, and a monostable multivibrator 253. Further, the cesium oscillator includes other structural elements, which will be described in detail later.

The cesium oscillator includes the crystal oscillator 211 which provides a signal of a predetermined frequency as the output frequency signal of the cesium oscillator. The cesium oscillator includes the modulator 213, the oscillator 215, the synthesiser 217, the cesium beam tube 219, the integrator 223, the synchronous detector 225, and the first bandpass amplifier 227 so as to form a feedback loop for controlling the oscillation frequency of the crystal oscillator 211.

The modulator 213 phase-modulates the output signal of the crystal oscillator 211 (10 MHz, for example) to obtain the central peak of atomic resonance. The synthesiser 217 synthesizes phase-modulated signals from the modulator 213 and outputs a microwave signal, which has been phase-modulated and is of a frequency near 9.192 GHz at which the atomic resonance effect of cesium occurs.

The cesium beam tube 219 outputs a resonance signal related to the frequency of the signal supplied from the synthesiser 217. The first bandpass amplifier 227 amplifies the fundamental wave of the signals drawn from the cesium beam tube 219. The amplified fundamental wave is subjected to the synchronous detection through the synchronous detector 225. The output signal of the synchronous detector 225 is integrated by the integrator 223. The output signal (control voltage) of the integrator 223 is supplied to a control terminal 211a of the crystal oscillator 211 through the contact 221. The oscillation frequency of the crystal oscillator 211 is controlled based on the voltage level defined by the integrator 223.

The following structural elements are provided in order to control a timing with which the feedback loop is established, which is used for controlling the crystal oscillator 211 at a predetermined peak point (the aforementioned peak point b shown in FIG. 2). The second bandpass amplifier 231 amplifies second-harmonic frequency signals supplied from the cesium beam tube 219. A lock circuit 237 detects one of the peaks a, b and c of the amplified second-harmonic frequency signals supplied from the second amplifier 231. The output signal of the lock circuit 237 is supplied to the integrator 233. A detection circuit 239 measures temperature of $Cs^{133}$ in the cesium beam tube 219 so as to detect an end of the resonance pattern range. The detection circuit 239 supplies the monostable multivibrator 253 with an instruction when the frequency comes into the resonance pattern range and one peak (peak a, for example) is detected based on measured temperature of $Cs^{133}$. The detection circuit 239 may be based on the voltage level of the signal derived from the integrator 223, as indicated by broken lines shown in FIG. 6. That is, a voltage comparator 261 compares the voltage signal from the integrator 223 with a reference voltage Vref, and outputs a control signal when the output signal of the integrator 233 becomes equal to the reference voltage Vref.

The highest-level hold circuit 233 holds the highest level among the levels of the second-harmonic frequency signals supplied from the second bandpass amplifier through a contact 235, which is driven by a drive circuit 255. The comparator 241 compares the levels of the second-harmonic frequency signals supplied from the second bandpass amplifier 231 through the contact 235 with the highest level held in the highest-level hold circuit 233. The sweep circuit 251 continuously varies the frequency of the crystal oscillator 211 over the predetermined frequency range. This is done by changing the voltage to be applied to the control terminal 211a of the crystal oscillator 211. The monostable multivibrator 253 outputs a pulse signal of a predetermined pulse width in response to the output signal of the detection circuit 239. The pulse width is selected so that the sweep circuit 151 can sweep the oscillation frequency over the resonance frequency range including the peaks a, b and c.

The contact 221, which is controlled by the drive circuit 243, connects the crystal oscillator 211 to either the integrator 223 or the sweep circuit 251. The contact 235, which is controlled by the drive circuit 255, connects the second bandpass amplifier 231 to either the highest-level hold circuit 233 or the comparator 241. A contact 257 is provided between the sweep circuit 251 and the monostable multivibrator 253, and is controlled by the drive circuit 243.

A description is given of an operation of the embodiment. In the initial state of the cesium oscillator before starting the power supply, the contact 235 connects the second bandpass amplifier 231 to the highest-level hold circuit 233 together, and the contact 257 connects the sweep circuit 251 and the monostable multivibrator 253 (ON state). Further, in the initial state, the contact 221 connects the crystal oscillator 211 to the sweep circuit 251.

In the following operation, the sweep circuit 251 sweeps the oscillation frequency of the crystal oscillator 211 for two times. During the first sweep operation, the highest level is held in the highest-level hold circuit 233. During the second sweep operation, the feedback loop is made closed when the level of the second-harmonic frequency signal from the second bandpass amplifier 231 becomes equal to the held highest level.

Operation During the First Sweep Operation

After the power supply to the cesium oscillator is started, the oscillation frequency comes into the resonance pattern range in accordance with the first frequency sweep operation. In this operation, the sweep circuit 251 may control the oscillation frequency of the crystal oscillator 211 so as to increase or decrease. When the sweep circuit 251 controls the oscillation frequency so as to increase for example, the oscillation frequency comes into the resonance pattern range from the lower end thereof. Temperature of the cesium source (furnace)) rises slowly than the crystal oscillator 211 starts up and becomes the stable state. Therefore, when temperature of the cesium source (furnace) reaches a predetermined temperature, the detection circuit 238 instructs the monostable multivibrator 253 to start sweeping the output frequency signal of the crystal oscillator 211. In this manner, the frequency range to be swept includes the central peak (b) without exception. In response to the instruction from the detection circuit 239, the monostable multivibrator 253 generates one shot pulse signal (a rectangular wave output), which is supplied to the sweep circuit 251 and the drive circuit 255. The above-mentioned first sweep operation is once required at the time of starting up the cesium oscillator. Thus, the instruction from the detection circuit 239 is only once supplied to the monostable multivibrator 253.

Figure 7:
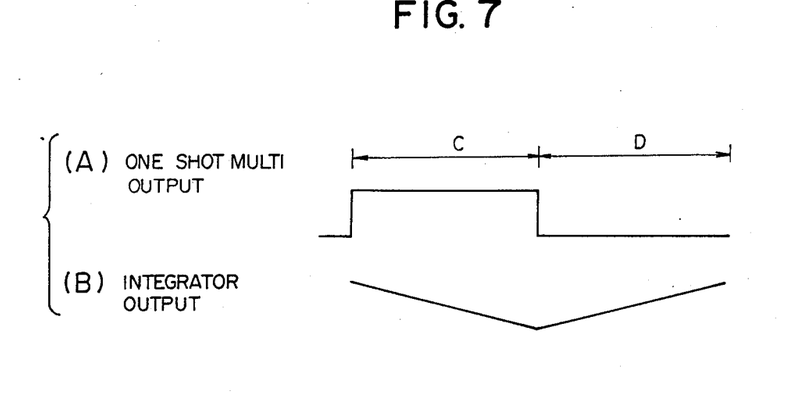
FIG. 7 is a waveform diagram of input and output signals with respect to a sweep circuit used in the embodiment of FIG. 6.

FIG. 7 is a waveform diagram of the rectangular signal derived from the monostable multivibrator 253 (A), and the signal derived from the sweep circuit 251 (B). As will be described in detail later, the sweep circuit 251 can be made up of an operational amplifier, a resistor, and a capacitor. A section C indicates a period during which the output signal of the monostable multivibrator 253 is held at a high level. The sweep circuit 251 integrates the output signal shown in FIG. 7(A) during the section C. In the illustrated example, the output signal of the sweep circuit 251 decreases gradually during the section C. This decreasing signal is supplied to the crystal oscillator 211 through the contact 221. Alternatively, it is possible for the sweep circuit 151 to generally increase the frequency during the section C.

The oscillation frequency of the crystal oscillator 211 is controlled based on the integrated output serving as the control voltage for the sweep circuit 251. When the signal supplied from the monostable multivibrator 253 is being at high level, the oscillation frequency of the crystal oscillator 211 is continuously changed, so that the first sweep operation is executed.

The output signal of the monostable multivibrator 253 is supplied to the drive circuit 255, which executes a switching operation based on the output signal of the monostable multivibrator 253. During the time when the output signal of the monostable multivibrator 253 is at high level, the drive circuit 255 controls the contact 235 so as to connect the second bandpass amplifier 231 and the highest-level hold circuit 233. On the other hand, during the time when the output signal of the monostable multivibrator 253 is at a low level (a section D shown in FIG. 7), the drive circuit 255 controls the contact 235 so as to connect the second bandpass amplifier 231 and the comparator 241. As will be described later, the second sweep operation is performed when the output signal of the monostable multivibrator 253 is at low level. During the first sweep operation, the output signal of the second bandpass amplifier 231 is connected to the highest-level hold circuit 233. In this state, the amplified second-harmonic frequency signals are supplied to the highest-level hold circuit 233 through the contact 235. As described previously, the highest-level hold circuit 233 holds the highest level among the levels of the amplified second-harmonic frequency signals. Therefore, the level of the amplified second-harmonic frequency signal corresponding to the peak b shown in FIG. 2 (largest second-harmonic signal) is held by the highest-level hold circuit 233.

Operation During the Second Sweep Operation

When the output signal of the monostable multivibrator 253 is switched to the low level (the section D), the output signal level of the sweep circuit 251 is switched so as to increase, as shown in FIG. 7. Thus, the oscillation frequency of the crystal oscillator 211 decreases if it is controlled so as to increase in the first sweep operation.

At the same time as the fall of the output signal of the monostable multivibrator 253, the drive circuit 255 controls the contact 235 so as to connect the second bandpass amplifier 231 and the comparator 241. During the second sweep operation, the comparator 241 compares the levels of the amplified second-harmonic frequency signals with the highest level held in the highest-level hold circuit 233. When the highest level equal to the held level is obtained, the comparator 241 supplies the drive circuit 243 with the aforementioned instruction. That is, when the peak point b shown in FIG. 2 is detected in the second sweep operation, the two input signals to the comparator 241 become equal to each other.

The drive circuit 243 receives the instruction supplied from the comparator 241, and switches the connection state in each of the contacts 221 and 257 so that the sweep circuit 251 is disconnected from the monostable multivibrator 253, and the control terminal 211a of the crystal oscillator 211 is connected to the integrator 223. Thereby, the feedback loop for controlling the the crystal oscillator 211 is established, and the oscillation frequency is always controlled near the peak point b shown in FIG. 2. During control, the lock circuit 237 supplies the integrator 223 with the instruction which shows the control voltage should increase or decrease. Thus, there is no possibility that the oscillation frequency is controlled at the peak point a or c at the starting up the cesium oscillator or due to aging. As a result, an increased adjustable frequency range and therefore an increased gain of the feedback loop are obtained. Additionally, a simple adjustment procedure is achieved.

Figure 8:
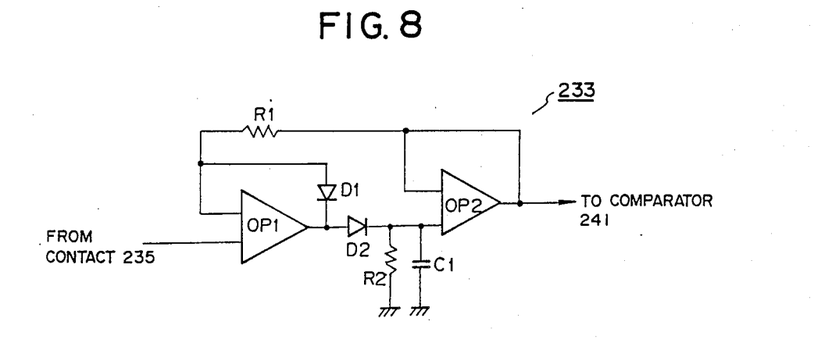
FIG. 8 is a circuit diagram of a highest-level hold circuit used in the configuration shown in FIG. 6.

Referring to FIG. 8, there is illustrated a circuit configuration of the highest-level hold circuit 233 in FIG. 6. The illustrated circuit is made up of two operational amplifiers OP1, OP2, two diodes D1, D2, two resistors R1, R2, and a capacitor C1. The highest level of the second-harmonic frequency signal is held in the capacitance C1. The output signal of the second bandpass amplifier 231 is supplied to one of the two input terminals of the operational amplifier OP1, an output signal of which is supplied to one of the two input terminals of the operational amplifier OP2 through the diode D2. The resistor R2 and the capacitor C1 are connected to the operational amplifier OP2. The output terminal of the operational amplifier OP2 is connected to the other input terminal thereof and the other input terminal of the operational amplifier OP1 through the resistor R1. The diode D1 connects the other input terminal of the operational amplifier OP1 and the output terminal thereof.

Figures 9A, 9B:
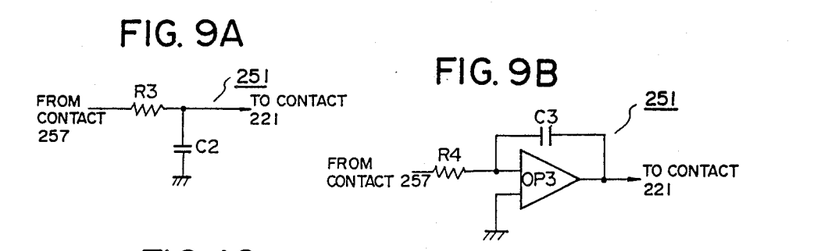
FIGS. 9A and 9B are circuit diagrams of a sweep circuit used in the configuration shown in FIG. 6.

FIG. 9A is a circuit diagram of a configuration of the sweep circuit 251. The illustrated circuit is an integrating circuit made up of a resistor R3 and a capacitor C2. The pulse signal derived from the monostable multivibrator 253 is integrated in the capacitor C2 through the resistor R3. The integrated signal is supplied to the crystal oscillator 211 through the contact 221. Another configuration of the sweep circuit 251 is shown in FIG. 9B. The illustrated sweep circuit 251 is made up of an operational amplifier OP3, a resistor R4 and a capacitor C3. The pulse signal derived from the monostable multivibrator 253 is integrated in the capacitor C3, which is connected to one of the two input terminals of the operational amplifier OP3 and the output terminal thereof. The other input terminal of the operational amplifier OP3 is connected to a negative power source (ground for the illustrated configuration).

Figures 10, 11:
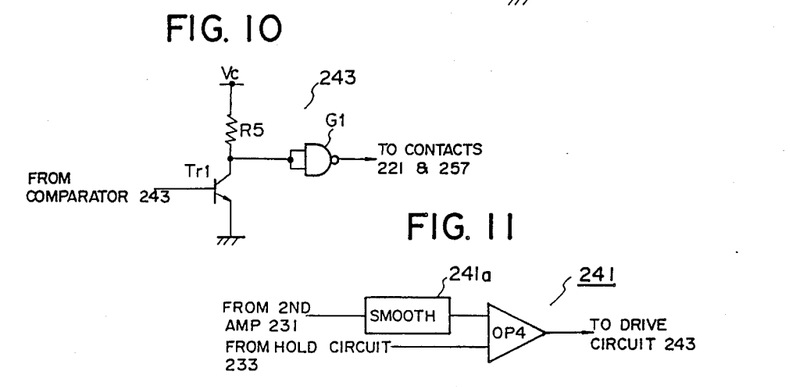
FIG. 10 is a circuit diagram of a drive circuit used in the configuration of FIG. 6.
FIG. 11 is a circuit diagram of a comparator used in the configuration of FIG. 6.

FIG. 10 is a circuit diagram of the drive circuit 243. As shown, the drive circuit 243 is made up of a transistor Tr1, a resistor R5 and a gate G1. The base of the transistor Tr1 is connected to the comparator 241 (FIG. 6). The resistor R5 is connected between a positive power source Vc and the collector of the transistor Tr1. The drive output is drawn from the collector of the transistor Tr1 through the gate G1. The emitter of the transistor Tr1 is connected to the negative power source (ground). The drive circuit 255 may be formed in the same as the drive circuit 243.

The comparator 241 can be formed by an operational amplifier OP4, as shown in FIG. 11. One of two terminals of the operational amplifier OP4 is supplied with the output signal of the second amplifier 231 through a smoothing circuit 241a. Alternatively, the output signal of the second amplifier 231 may directly be supplied to the input terminal of the operational amplifier. The other input terminal of the operational amplifier OP4 is supplied with the output signal of the highest-level hold circuit 233.

Figure 12:
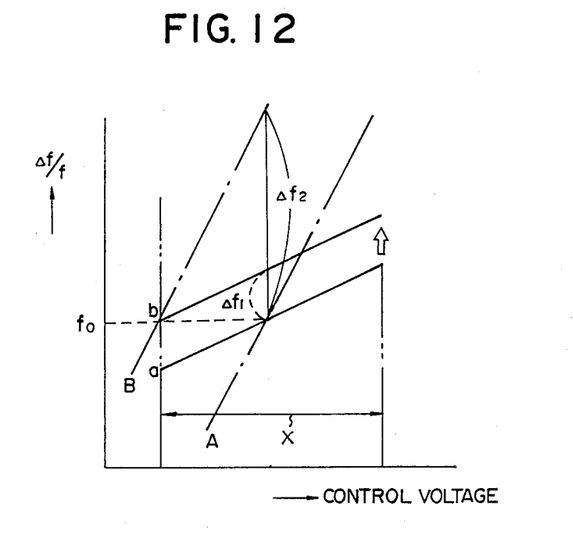
FIG. 12 is a graph of a frequency-control voltage characteristic.

According to the present invention, an increased adjustable frequency range of the output frequency signal derived from the crystal oscillator 111 or 211 presents not only an increased loop gain but also the following advantage. Referring to FIG. 12, there is illustrated a frequency vs. control voltage characteristic. A character X denotes an adjustable control voltage range of the crystal oscillator, and $f_0$ is a frequency corresponding to the largest peak b (FIG. 2). A line P1 is an initial frequency-control voltage characteristic of the crystal oscillator 411 in the conventional cesium oscillator shown in FIG. 1, and a line Q1 is an initial frequency-control voltage characteristic for the present invention. It can be seen from the graph of FIG. 12 that the adjustable frequency range for the present invention is larger than that for the conventional cesium oscillator. Even if the frequency-control voltage characteristic of the crystal oscillator 411 changes from P1 to P2 due to aging thereof, it can correctly operate and outputs the oscillation signal corresponding to the largest peak b. This is because the frequency $f_0$ is still present in the adjustable frequency range P2 with respect to the adjustable control voltage range. However, if the frequency-control voltage characteristic further changes, or in other words, a change of the frequency-control voltage characteristic is larger than $\Delta f_1$, the crystal oscillator 411 no longer operates correctly. At this time, the frequency $f_0$ is out of the adjustable frequency range of the oscillator.

On the other hand, according to the present invention, the crystal oscillator 111 or 211 can correctly operate even if the frequency-control voltage characteristic changes from Q1 to Q2, or changes by a frequency variation $\Delta f_2$ larger than $\Delta f_1$. This means that the range over which the crystal oscillator can operate correctly increases with an increase of the adjustable frequency range.

The present invention is not limited to the aforementioned embodiments, and variations and modifications may be made without departing from the scope of the present invention.

What is claimed is:

1. A cesium oscillator comprising:
   a cesium beam tube;
   oscillator means, coupled to said cesium beam tube, for generating an oscillation signal of a frequency, said cesium beam tube being supplied with said oscillation signal and thereby outputting a resonance signal;
   sweep means, coupled to said oscillator means, for continuously varying the frequency of said oscillation signal, the frequency of said oscillation signal being continuously varied two times when the frequency of said oscillation signal is to be adjusted;
   hold means, coupled to said cesium beam tube, for holding the highest signal level of said resonance signal supplied from said cesium beam tube when said sweep means continuously varies the frequency of said oscillation signal first; and
   control means, coupled to said oscillator means, said sweep means and said hold means, for controlling said sweep means so as to stop continuously varying the frequency when the signal level of said resonance signal obtained by continuously varying the frequency of said oscillation signal by said sweep means for the second time, becomes equal to said highest signal level held by said hold means.

2. A cesium oscillator as claimed in claim 1, wherein said oscillator means includes a terminal and changes the frequency of said oscillation signal based on a control voltage applied to said terminal, and wherein said sweep means includes first means for generating said control voltage which is to be applied to said terminal when said sweep means continuously varies the frequency of said oscillation signal two times.

3. A cesium oscillator as claimed in claim 2, wherein said sweep means includes second means for generating said control voltage which is to be applied to said terminal after said control means controls said sweep means so as to stop continuously varying the frequency of said oscillation signal, and wherein said second means generates said control voltage based on said resonance signal from said cesium beam tube so that said oscillator means always outputs said oscillation signal of the frequency equal to a fixed frequency.

4. A cesium oscillator as claimed in claim 3, wherein said control means includes loop control means, coupled to said sweep means, for connecting said first means to said oscillator means during the time when said sweep means continuously varies the frequency of said oscillation signal and for connecting said second means to said oscillator means so as to form a feedback loop including said oscillator means, said cesium beam tube and said frequency varying means after said sweep means stops continuously varying the frequency.

5. A cesium oscillator as claimed in claim 2, wherein said first means includes integrating means for integrating a predetermined voltage signal based on said resonance signal and thereby outputting a variable voltage which is applied, as said control voltage, to said terminal of said oscillator means.

6. A cesium oscillator as claimed in claim 2, wherein said resonance signal includes a plurality of resonance frequencies and said first means varies the frequency of said oscillation signal over a frequency range including said plurality of resonance frequencies.

7. A cesium oscillator as claimed in claim 3, wherein said resonance signal includes a plurality of resonance frequencies, and said second means has an adjustable frequency range which includes only the resonance frequency of a level higher than levels of the other resonance frequencies of said resonance signal.

8. A cesium oscillator as claimed in claim 1, wherein said sweep means continuously varies the frequency of said oscillation signal so as to increase first and decrease second.

9. A cesium oscillator as claimed in claim 1, wherein said sweep means continuously varies the frequency of said oscillation signal so as to decrease first and decrease second.

10. A cesium oscillator as claimed in claim 5, further comprising:
detection means for detecting a peak of said said resonance signal during the time when said frequency of said oscillation signal is continuously varied first and for outputting a detection signal when detected; and
pulse generating means for generating a pulse signal of a predetermined pulse width in response to said detection signal from said detection means,
wherein said pulse signal is applied, as said predetermined voltage signal, to said integrating means.

11. A cesium oscillator as claimed in claim 10, wherein said pulse generating means includes a monostable multivibrator to which said detection signal is applied.

12. A cesium oscillator as claimed in claim 4, wherein:
said resonance signal supplied from said cesium beam tube includes an alternating component, and said hold means holds the highest level of a second-harmonic signal of a frequency twice the frequency of said alternating component,
said control means includes comparing means for comparing the highest level of said second-harmonic signal held by said hold means and the signal level of said resonance signal obtained by continuously varying the frequency of said oscillation signal for the second time and for generating a switching signal to be supplied to said loop control means when both the levels becomes identical to each other,
said loop control means connects said second means to said oscillator means when said comparing means generates said switching signal.

13. A cesium oscillator as claimed in claim 10, wherein:
said resonance signal supplied from said cesium beam tube includes an alternating component, and said hold means holds the highest level of a second-harmonic signal of a frequency twice the frequency of said alternating component,
said control means includes comparing means for comparing said highest level of the second-harmonic signal held by said hold means and the signal level of said resonance signal obtained by continuously varying the frequency of said oscillation signal for the second time and for generating a switching signal to be supplied to said loop control means when both the levels becomes identical to each other, said loop control means connecting said second means to said oscillator means when said comparing means generates said switching signal; and
selecting means for selectively coupling said cesium beam tube to one of said hold means and said comparing means,
said selecting means selects said hold means when said pulse signal generated by said pulse generating means is supplied thereto, and selects said comparing means when said pulse signal is turned off.

14. A cesium oscillator as claimed in claim 12, wherein said comparing means includes smoothing means for smoothing said resonance signal supplied from said cesium beam tube.

15. A cesium oscillator as claimed in claim 1, wherein said resonance signal supplied from said cesium beam tube has been modulated by a modulation frequency, and includes a first signal of a fundamental frequency and a second-harmonic frequency signal of a frequency which is twice the modulation frequency, and wherein said second signal is supplied to said hold means and said control means.

16. A cesium oscillator as claimed in claim 3, wherein said resonance signal supplied from said cesium beam tube has been modulated by a modulation frequency, and includes a first signal of a fundamental frequency and a second-harmonic frequency signal of a frequency which is twice the modulation frequency, and wherein said first signal is supplied to said second means.

17. A cesium oscillator as claimed in claim 10, wherein the frequency of said detected peak of the resonance signal is lower than the frequency of said oscillation signal derived from said oscillator means.

18. A cesium oscillator as claimed in claim 10, wherein said detection means detects the peak of said resonance signal by measuring temperature of cesium atoms in said cesium beam tube.

19. A cesium oscillator as claimed in claim 1, wherein said oscillator means includes means for providing said oscillation signal with an alternating signal component, and wherein said oscillation signal having said alternating signal component is supplied to said cesium beam tube.

20. A cesium oscillator as claimed in claim 1, wherein said oscillator means includes a voltage controlled crystal oscillator, and said oscillation signal is an output frequency signal of said voltage controlled crystal oscillator.

21. A cesium oscillator comprising:
oscillator means for generating an oscillation signal of a frequency;
a cesium beam tube;
modulation means, coupled to said oscillator means and said cesium beam tube, for providing said oscillation signal with an alternating signal component and for supplying said oscillation signal having said alternating signal to said cesium beam tube, said cesium beam tube outputting a signal including a first signal component and a second-harmonic frequency signal component of a frequency which is twice the frequency of said alternating signal;
controlling means, coupled to said cesium beam tube and said oscillator means, for controlling the frequency of said oscillation signal on the basis of the first signal component supplied from said cesium beam tube;
sweep means, coupled to said oscillator means, for continuously varying the frequency of said oscillation signal generated by said oscillator means over a predetermined frequency range;
hold means, coupled to said cesium beam tube, for holding the highest level of said second-harmonic frequency signal component;
comparing means, coupled to said cesium beam tube and said hold means, for comparing the signal level of said second-harmonic frequency signal component with said highest level held by said hold means and for outputting comparison results; and
loop controlling means for establishing a feedback loop including said oscillator means, said cesium beam tube, said modulation means and said controlling means so as to fix the frequency of said oscillation signal to a predetermined frequency when said comparison results satisfy a predetermined condition.

22. A cesium oscillator as claimed in claim 21, wherein said loop controlling means establishes said feedback loop when the level of said second-harmonic frequency signal component becomes equal to said signal level held by said hold means.

* * * * *

UNITED STATES PATENT AND TRADEMARK OFFICE
CERTIFICATE OF CORRECTION

PATENT NO. : 4,914,403
DATED : April 3, 1990
INVENTOR(S) : Yoshifumi NAKAJIMA et al.

It is certified that error appears in the above-identified patent and that said Letters Patent is hereby corrected as shown below:

Col. 1, line 17, change "synthesiser" to --synthesizer--.

Col. 2, line 42, change "A,," to --A',--;
line 47, change "A," to --A'--;
line 68, after "generating" insert --a--.

Col. 3, line 4, change "an" to --a--.

Col. 4, line 39, change "synthesiser" to --synthesizer--.

Col. 7, line 43, change "))" to --)--, and change "than" to --and then--.

Col. 11, line 59, delete "said" (second occurrence).

Col. 12, lines 19 and 38, change "becomes" to --become--.

Signed and Sealed this

Eighth Day of October, 1991

Attest:

HARRY F. MANBECK, JR.

*Attesting Officer*  *Commissioner of Patents and Trademarks*